(12) United States Patent
Clarke et al.

(10) Patent No.: US 11,894,477 B2
(45) Date of Patent: *Feb. 6, 2024

(54) ELECTRICAL DEVICE WITH STRESS BUFFER LAYER AND STRESS COMPENSATION LAYER

(71) Applicant: Raytheon Company, Waltham, MA (US)

(72) Inventors: Andrew Clarke, Santa Barbara, CA (US); Emily Thomson, Lompoc, CA (US); Michael Rondon, Santa Rosa, CA (US)

(73) Assignee: Raytheon Company, Tewksbury, MA (US)

( * ) Notice: Subject to any disclaimer, the term of this patent is extended or adjusted under 35 U.S.C. 154(b) by 179 days.

This patent is subject to a terminal disclaimer.

(21) Appl. No.: 17/322,073

(22) Filed: May 17, 2021

(65) Prior Publication Data

US 2022/0367740 A1    Nov. 17, 2022

(51) Int. Cl.
*H01L 27/146* (2006.01)
*H01L 31/0392* (2006.01)
(Continued)

(52) U.S. Cl.
CPC .... *H01L 31/03925* (2013.01); *H01L 27/1465* (2013.01); *H01L 27/1469* (2013.01);
(Continued)

(58) Field of Classification Search
None
See application file for complete search history.

(56) References Cited

U.S. PATENT DOCUMENTS

| 595,340 A | 12/1897 | Restein |
| 5,365,088 A | 11/1994 | Myrosznyk |

(Continued)

FOREIGN PATENT DOCUMENTS

| EP | 0635892 B1 | 6/2002 |
| WO | 2007096405 A1 | 8/2007 |

(Continued)

OTHER PUBLICATIONS

"Stress Control in AlN and Mo Films for Electro-Acoustic Devices", V. Felmetsger and P. Laptev, Conference Paper, Jun. 2008 DOI: 10.1109/FREQ.2008.4623076 Source: IEEE Xplore.

(Continued)

*Primary Examiner* — Benjamin P Sandvik
(74) *Attorney, Agent, or Firm* — Renner, Otto, Boisselle & Sklar LLP (57) ABSTRACT

An electrical device includes a substrate with a compressive layer, a neutral stress buffer layer and a tensile stress compensation layer. The stress buffer layer and the stress compensation layer may each be formed with aluminum nitride using different processing parameters to provide a different intrinsic stress value for each layer. The aluminum nitride tensile layer is configured to counteract stresses from the compressive layer in the device to thereby control an amount of substrate bow in the device. This is useful for protecting fragile materials in the device, such as mercury cadmium telluride. The aluminum nitride stress compensation layer also can compensate for forces, such as due to CTE mismatches, to protect the fragile layer. The device may include temperature-sensitive materials, and the aluminum nitride stress compensation layer or stress buffer layer may be formed at a temperature below the thermal degradation temperature of the temperature-sensitive material.

10 Claims, 7 Drawing Sheets

(51) Int. Cl.
    *H01L 31/0296* (2006.01)
    *H01L 31/103* (2006.01)
    *H01L 31/18* (2006.01)
(52) U.S. Cl.
    CPC .... *H01L 31/02966* (2013.01); *H01L 31/1032* (2013.01); *H01L 31/1832* (2013.01)

(56) References Cited

U.S. PATENT DOCUMENTS

| | | | |
|---|---|---|---|
| 5,959,340 | A | 9/1999 | Wan |
| 7,564,057 | B1 | 7/2009 | Yamazaki |
| 8,481,376 | B2 | 7/2013 | Saxler |
| 8,808,513 | B2 | 8/2014 | Laptev et al. |
| 9,412,902 | B2 | 8/2016 | Shatalov |
| 10,515,905 | B1 | 12/2019 | Rondon |
| 11,410,937 | B2 | 8/2022 | Clarke |
| 2003/0013218 | A1 | 1/2003 | Chason |
| 2003/0033974 | A1* | 2/2003 | Ueda ............... H01L 21/0254 257/E21.119 |
| 2011/0140118 | A1* | 6/2011 | Ramdani ........... H01L 21/02592 438/483 |
| 2011/0140242 | A1* | 6/2011 | Ramdani ............ H01L 21/0237 257/E29.166 |
| 2013/0296158 | A1 | 11/2013 | Cao |
| 2014/0110754 | A1 | 4/2014 | Jain |
| 2015/0319390 | A1* | 11/2015 | Sanchez ............... H04N 25/46 250/208.1 |
| 2019/0385954 | A1 | 12/2019 | Rondon et al. |
| 2020/0035739 | A1* | 1/2020 | Saito ............... H01L 27/14634 |
| 2021/0249462 | A1 | 8/2021 | Huang |
| 2021/0280531 | A1* | 9/2021 | Clarke .................. H01L 25/18 |
| 2022/0052099 | A1* | 2/2022 | Ito .................... H01L 27/14623 |
| 2022/0285298 | A1 | 9/2022 | Clarke |
| 2022/0372651 | A1 | 11/2022 | Clarke |

FOREIGN PATENT DOCUMENTS

| | | |
|---|---|---|
| WO | 2016209282 A1 | 12/2016 |
| WO | 2021178031 A1 | 9/2021 |

OTHER PUBLICATIONS

Invitation to Pay Additional Fees dated Aug. 12, 2022 in corresponding International Application No. PCT/US2022/026704.

Venkataraj, et al., "Structural, optical and mechanical properties of aluminum nitride films prepared by reactive DC magnetron sputtering," Thin solids Films, 502, (2006), pp. 235-239.

Ryu, et al., "Stress-Induced Delamination Of Through Silicon Via Structures", AIP Conf Proc. 1378, 153 (2011).

Zhao, et al., "Effect of Thermal Mechanical Behaviors of Cu on Stress Distribution in Cu-Filled Through-Silicon Vias Under Heat Treatment", J. Elect. Mat. 47, 142-147 (2018).

Reed et aL, "Tensile Strength and Ductility of Indium", (NIST), Mat. Sci. and Eng. A, 102 (1988) 227-236.

Cheng, et al., "Mechanical Response of Indium Micro-joints to Low Temperature Cycling", 2009 Electronic Components and Technology Conference, p. 1792-1795.

Zhang et al., "Characterization of nanoscale chips and a novel model for face nanogrinding on softbrittle HgCdTe films", Tribol. Lett. 49, 203-215 (2013).

Felmetsger et al.; "Stress control in AlN and Mo films for electro-acoustic devices"; 2008 IEEE International Frequency Control Symposium; IEEE, 2008.

Lang et al.; "Stress compensation techniques in thin layers applied to silicon micromachining"; MRS Online proceedings Library Archive 284; 1992; Abstract only.

Mackenzie et al.; "Stress control of Si-based PECVD dielectrics"; Proceedings of the 207th Electrochemical Society Meeting; 2005.

Panda et al.; "Reduction of residual stress in AlN thin films synthesized by magnetron sputtering technique." Materials Chemistry and Physics 200 (2017): 78-84.

Butcher et al., "Predeposition 1-9, 14, ultraviolet treatment for adhesion 15, 17-20 improvement of thin films on mercury cadmium telluride," Journal of Vacuum Science, American Institute of Physics, 2 Huntington Quadrangle, Melville, NY 11747, vol. 19, No. 1, Jan. 1, 2001, pp. 90-96.

PhD Thesis of Jing Zhang, "A Fundamental Study of Interface Effects in HgCdTe Materials and Devices", 2015, University of Western Australia.

S.K. Jha et al., "Bake stability of CdTe and ZnS on HgCdTe: An x-ray photoelectron spectroscopy study", J. Elect. Mat. Aug. 2003, vol. 32(8), pp. 899-905.

R. Singh, A.K. Gupta and K.C. Chhabra, "Surface Passivation of Mercury-Cadmium-Telluride Infrared Detectors", Def. Sci. J., vol. 41, No. 3, Jul. 1991, pp. 205-239.

\* cited by examiner

ELECTRICAL DEVICE WITH STRESS BUFFER LAYER AND STRESS COMPENSATION LAYER

TECHNICAL FIELD

The present invention relates generally to electrical devices, and more particularly to an electrical device having a stress buffer layer and/or stress compensation layer and method for making same.

BACKGROUND

Electrical devices, such as semiconductor integrated circuits (ICs) or other semiconductor devices, are typically fabricated into and/or on a substrate, such as a silicon wafer, resulting in an IC area that generally increases in size and density as the complexity of the IC increases. One trend in recent IC fabrication has been to increase the number and/or different types of ICs by vertically stacking and vertically interconnecting the ICs together. Generally, each of the vertically stacked ICs can be of different sizes, come from different size wafers, have different functions, be made of different materials, etc.

Some conventional methods for realizing the approach of vertically stacking and integrating ICs is through a direct bond or hybrid bond process. Commonly, after a desired number of individual ICs have been vertically stacked, the stacked electrical device assembly undergoes a temperature treatment to cause diffusion between insulating and conducting structure(s) of the opposing ICs resulting in a 3D-integrated electrical device structure with an electrical connection across the stacked ICs.

SUMMARY

One problem with some electrical devices, such as sensor semiconductor devices for example, is that temperature-sensitive materials may be required in the utilization of such devices, which makes these devices susceptible to the processing conditions leading up to and during 3D-integration. As an example, photodetectors for sensing infrared light may utilize temperature-sensitive photoconductor materials such as $Hg_{1-x}Cd_xTe$ (commonly referred to as "MCT"). The thermal degradation temperature of MCT at which properties of the material are deleteriously affected is in the range from 120° C. to 150° C.

Another problem with some electrical devices is that they may incorporate fragile materials into their architecture, for example materials with low fracture toughness, in which tensile forces imparted on the fragile material will cause damage and/or interrupt proper operation of the material. MCT is an example of a fragile material that is susceptible to damage (e.g., defects, crack propagation, and/or interface failure) and/or electrical interruption (e.g., piezoelectric response) when experiencing a relatively small amount of tensile strain. For example, the Kc fracture toughness of MCT may be about 0.20 $MPa \cdot m^{1/2}$ by Vickers indentation testing.

In some instances, excessive tensile strain causing failure of fragile materials in the electrical device may be the result of coefficient of thermal expansion (CTE) mismatches between the materials used in fabricating such electrical device. The CTE mismatches and thus excessive tensile or compressive strain may be the result of fabrication processes, such as elevated temperature processing during bonding and 3D-integrating the device. Alternatively or additionally, the CTE mismatches may result from operating temperatures of the device which may be in a temperature regime that is far from standard ambient temperature (i.e., 25° C. according to IUPAC standards). For example, some types of infrared detectors may operate at a temperature much lower than room temperature, in the range of about −200° C. This has been found to cause interrupted electrical communication between interconnect structures in the electrical device due to coefficient of thermal expansion (CTE) mismatches between different structures in the device.

In view of at least the foregoing, to facilitate fabrication and/or operation of such electrical devices, an aspect of the present disclosure provides a stress compensation layer in the device to counteract bowing forces from other layer(s) in the device to thereby control an amount of substrate bow. For example, an anti-deflection tensile layer may be provided in the device to counteract bowing forces from compressive layer(s) of the device. The stress compensation layer can eliminate the need for back side depositions on the substrate during bonding oxide deposition, for example. The stress compensation layer also may reduce strain at an interface to the underlying fragile layer (e.g., MCT, for example). In exemplary embodiments, the stress compensation layer is a good dielectric capable of uniform deposition with a residual (intrinsic) tensile stress that counteracts bowing. The stress compensation layer may be about equal in magnitude but opposite sign to the layer creating deflection (e.g., bonding oxide layer). For example, the stress compensation layer may have a tensile stress in range from +10 MPa to +1 GPa, such as in the range of +200 MPa to +400 MPa. The stress compensation layer may minimize bow by compensating for the stress of other layers due to CTE mismatches. Such a stress compensation layer may have a CTE that closely matches that of a fragile layer (e.g., MCT), such that the stress compensation layer can reduce or eliminate strain at an interface to the fragile layer during processing and after cooling to room temperature, or during low-temperature operation.

Alternatively or additionally, to facilitate fabrication and/or operation of such electrical devices, an aspect of the present disclosure provides a stress buffer layer in the device to protect a fragile substrate (e.g., MCT) from damage by creating a low-stress interface and a rigid layer between the substrate and subsequent high-stress layers (such as bonding oxides, for example). In exemplary embodiments, the stress buffer layer is a good dielectric capable of uniform deposition, having a CTE close to that of the substrate, and with low or neutral (about zero) residual (intrinsic) stress. For example, the stress buffer layer may have a residual stress from around greater than −50 MPa to less than around +50 MPa, such as in a range from −30 MPa to +30 MPa. Generally, the stress buffer layer should be rigid enough not to transfer the upper-level interface strain generated by an overlying layer (e.g., a bonding oxide Layer) to an interface of an underlying fragile layer (e.g., MCT). Such a stress buffer layer may have a CTE that closely matches that of a fragile layer (e.g., MCT), such that stress buffer layer can reduce or eliminate strain at an interface to the fragile layer during processing and after cooling to room temperature, or during low-temperature operation.

Some materials that are suitable for stress compensation or stress buffer layers may have processing temperatures that are greater than the MCT thermal degradation temperature. Accordingly, another aspect of the present disclosure is to provide a stress compensation (anti-deflection) layer and/or stress buffer layer that is/are formed at lower temperature(s) than degradation temperature(s) of temperature-sensitive material(s) in the device and/or to provide such stress buffer or compensation layer(s) that compensate for CTE mismatches in the device.

More specifically, an aspect of the present disclosure provides an aluminum nitride (AlN$_x$) stress compensation layer for electrical devices that is configured to counteract deflection stresses. The aluminum nitride stress compensation layer may be a tensile layer that is configured to counteract compressive layer stresses in the device (such as from a bonding oxide layer) to thereby control an amount of substrate bow in the device. The AlN$_x$ stress compensation layer has a CTE that closely matches that of MCT, such as within about $1.0 \times 10^{-6}$/K of each other. For example, the AlN$_x$ stress compensation layer has a CTE of about $4.6 \times 10^{-6}$/K to about $5.5 \times 10^{-6}$/K and the MCT layer has a CTE of about $5.0 \times 10^{-6}$/K to about $5.6 \times 10^{-6}$/K.

Alternatively or additionally, another aspect of the present disclosure provides an aluminum nitride (AlN$_x$) stress buffer layer for electrical devices that is configured to provide a low-stress interface and rigid layer between an underlying layer (e.g., fragile layer such as MCT) and overlying higher-stress layer (e.g., bonding oxide, for example).

An aspect of the present disclosure also provides a method for making an aluminum nitride stress compensation layer (e.g. tensile layer) or aluminum nitride stress buffer layer (e.g., neutral layer) at relatively low temperatures such as for use with electrical devices that contain temperature-sensitive materials. The AlN$_x$ stress compensation layer or AlN$_x$ stress buffer layer also has a CTE that closely matches that of MCT, such as within about $1.0 \times 10^{-6}$/K of each other, which such exemplary values are provided above. For example, a neutral stress buffer layer of AlN$_x$ may be deposited onto MCT before a tensile stress compensation layer of AlN$_x$ to effectively protect the MCT interface and provide stress compensation for a final compressive stress layer of bonding oxide, such as SiO$_2$.

According to an aspect, an electrical device including: a substrate; a temperature-sensitive material supported by the substrate, the temperature-sensitive material having a thermal degradation temperature in a range from 50° C. to 250° C.; and (i) a stress buffer layer supported by the substrate and formable at a temperature less than the thermal degradation temperature of the temperature-sensitive material such that the stress buffer layer is configured to minimize strain at an interface of the temperature-sensitive material; and/or (ii) a stress compensation layer supported by the substrate and formable at a temperature less than the thermal degradation temperature of the temperature-sensitive material such that the stress compensation layer is configured to counteract forces imparted to the substrate to thereby control an amount of substrate bow.

According to another aspect, an electrical device includes: a substrate; a fragile material supported by the substrate, the fragile material having a K$_{IC}$ fracture toughness from 0.05 MPa·m$^{1/2}$ to 1.0 MPa·m$^{1/2}$; and (i) a stress buffer layer supported by the substrate and configured to minimize strain at an interface of the fragile material; and/or (ii) a stress compensation layer supported by the substrate and configured to counteract forces imparted to the fragile material; wherein a coefficient of thermal expansion (CTE) of the stress buffer layer and/or a CTE of the stress compensation layer are within a range from zero to $2.0 \times 10^{-6}$/K of a CTE of the fragile material.

According to another aspect, an electrical device includes: a substrate; an aluminum nitride (AlN$_x$) buffer layer overlying at least a portion of the substrate; at least one other layer overlying at least a portion of the aluminum nitride (AlN$_x$) buffer layer.

The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

DETAILED DESCRIPTION

The principles and aspects according to the present disclosure have particular application to electrical devices, such as integrated circuit (IC) devices, and more particularly vertically integrated semiconductor integrated circuit (IC) devices, including application specific integrated circuits (ASICs), focal plane arrays and intelligent image sensors, memory chips, monolithic microwave integrated circuits (MMICs), infrared electrical devices (e.g., infrared detectors), antenna circuits, stripline, distribution networks, etc., and will be described below chiefly in this context. It is understood, however, that the principles and aspects according to the present disclosure may be applicable to other electrical devices, or electrical circuits in general, where it is desirable to provide an aluminum nitride tensile layer for balancing forces and thereby controlling the amount of bow in such devices. Non-limiting examples of such electrical devices may include non-semiconductor devices, such as passive radio frequency (RF) circuits (for example, filters or antenna arrays), or other semiconductor devices, such as diodes, photocells, transistors, sensors, and the like. The exemplary method of forming the exemplary electrical device may also be applicable to vertically integrating both active and passive electrical devices.

Figure 1:
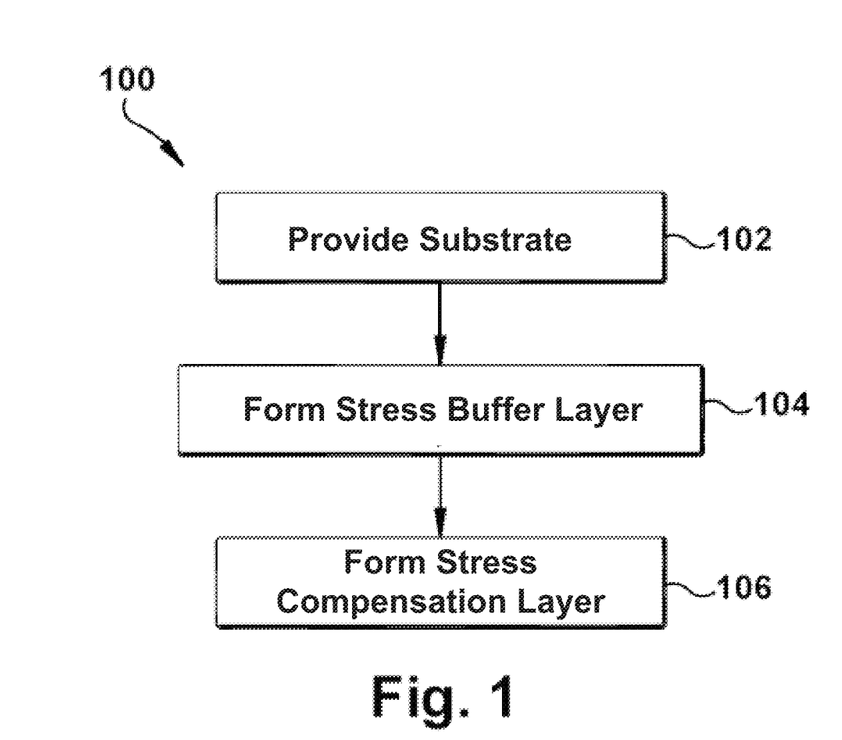
FIG. 1 is a high-level flow chart of an exemplary method of making a semiconductor device according to an embodiment of the present disclosure.

Referring to FIG. 1, an exemplary method 100 for forming a semiconductor device is shown, which generally includes the steps of: providing a substrate of the semiconductor device (step 102), forming a stress buffer layer (e.g., aluminum nitride layer ($AlN_x$)) overlying at least a portion of the substrate (step 104), and/or forming a stress compensation layer (e.g., aluminum nitride layer ($AlN_x$)) overlying at least a portion of the substrate (step 106).

FIGS. 2A-2H are schematic cross-sectional views depicting exemplary process steps for forming an exemplary electrical device 10 according to the method 100. In the illustrated embodiment, the semiconductor device 10 is a photodetector 10 that generally includes a substrate 12, a photoconductor layer 14 supported by the substrate 12, and an elevated stress layer 18 overlying at least a portion (e.g., major surface) of the substrate 12. The elevated stress layer 18 may be a compressive stress layer or bonding layer, for example. As shown, a stress compensation layer 16 is provided that is configured to counteract stresses from the elevated stress layer 18 (or other stress inducing layers, if any). Alternatively or additionally, a stress buffer layer 26 is provided between the elevated stress layer(s) (e.g., compressive layer 18) and the photoconductor layer 14 (or other fragile layer) to provide a low-stress interface and rigid layer between these layers 14, 18. It is understood that the depiction of the photoconductor 10 is exemplary, and any suitable form of electrical device may be used in accordance with the principles and aspects disclosed herein.

Figure 2A:
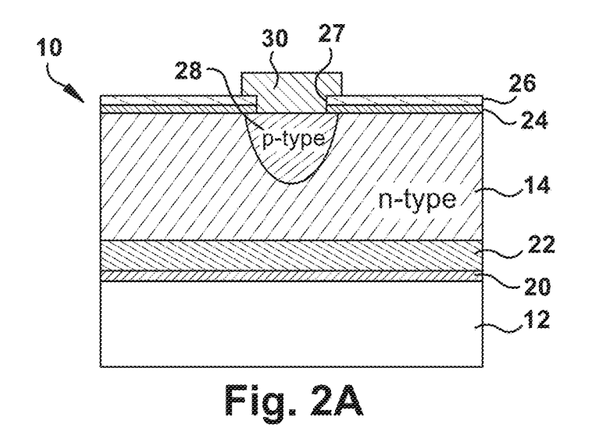
FIGS. 2A-2F are schematic cross-sectional views depicting exemplary process steps of forming the exemplary semiconductor device according to an embodiment of the present disclosure.

Referring to FIG. 2A, the step of providing the substrate 12 includes providing any suitable substrate for the electrical device 10 as may be desired for a particular application. In exemplary embodiments, the substrate 12 is a semiconductor material such as silicon, or other semiconductor materials such as III-V and/or II-VI materials, for example. In the illustrated embodiment for the photodetector 10, the substrate 12 is a silicon substrate which provides a window for transmission of photons to the photoconductor layer 14, as described in further detail below.

As shown in FIG. 2A, subsequent to providing the substrate 12 and before forming the photoconductor layer 14, the process includes forming one or more buffer layers 20, 22 overlying the substrate 12. As shown, the buffer layers 20, 22 may overlay the entirety of the substrate 12, or the buffer layers may overlay a portion of the substrate 12. In the illustrated embodiment of the photodetector 10, the first and second buffer layers 20, 22 are epitaxy buffer layers. For example, the first buffer layer 20 may be a seed layer such as cadmium zinc telluride (CdZnTe) or other suitable material. The seed layer 20 may be formed by molecular beam epitaxy (MBE) or liquid phase epitaxy (LPE) to a specified thickness. The thickness of the seed layer 20 may help to annihilate defects due to the lattice mismatch with the substrate (e.g., silicon). The second buffer layer 22 may be a cadmium telluride (CdTe) layer which may be grown atop the seed layer 20 via molecular beam epitaxy (MBE), for example. Such an approach to epitaxial growth permits formation of the second buffer layer 22 with fewer defects and/or dislocations.

As shown in the illustrated embodiment, the photoconductor layer 14 is formed atop the second buffer layer 22 (e.g., CdTe) with a photoconductive material (also referred to with reference number 14). As used herein, a photoconductive material (i.e., photoconductor, photoresistor, or photosensitive material) is a material that reacts to the absorption of electromagnetic radiation (e.g., visible, ultraviolet or infrared light) to become more electrically conductive. When a photoconductive material is connected as part of a circuit, the material functions as a resistor whose resistance depends on the light intensity. In this context, the material also is called a photoresistor (also called light-dependent resistor or photoconductor).

In exemplary embodiments, the photoconductive material 14 is an inorganic n-type or p-type semiconductor material that couples with an opposite p-type or n-type material (described below) to form a p-n junction and thereby uses a photovoltaic effect to produce photoelectric current in response to absorption of the light in a manner well-known in the art. In such materials, photoconductivity ensues when the photoconductive material 14 is bombarded with photons of sufficient energy to raise electrons across the material's band gap between the valence and conduction bands. More specifically, when an incident photon (e.g., IR photon) with sufficient energy is absorbed by the photoconductive material 14, the material reacts at the p-n junction to create a free electron-hole pair. At the p-n junction, the electrons migrate from the n-type doped material to the adjacent p-type material. The mobility of the charge carriers (e.g., an electron in an n-type material) will change the electrical resistance of the photoconductor material such that there is a voltage change across the device. This voltage change is proportional to the number of photo-generated charges, and thus measuring the change in voltage across the device provides a direct measure of the photons captured by the photoconductor material 14. Typically, this measurement is made by mating the photodetector 10 to a readout integrated circuit (ROIC) 70 (as shown in FIGS. 2G and 2H, for example and described in further detail below), which such operation of a photodetector and ROIC is well-known in the art.

In the illustrated embodiment, the photoconductive material 14 is mercury cadmium telluride (also referred to as "MCT") which is grown epitaxially by MBE on the CdTe buffer layer 22. The high-quality epitaxially-grown CdTe buffer layer 22 minimizes the number of dislocations and defects in the epitaxially-grown MCT photoconductor layer 14. The MCT material has a chemical formula $Hg_{1-x}Cd_xTe$, which generally includes the compounds of cadmium telluride (CdTe) and mercury telluride (HgTe). The fraction (stoichiometric ratio) of Hg to Cd controls the optical absorption of the material, such that the MCT material has a tunable bandgap spanning the shortwave infrared to the very long wave infrared regions. For example, CdTe is a semiconductor with a bandgap of approximately 1.5 electron volts (eV) at room temperature, and HgTe is a semimetal having a bandgap energy of zero. Therefore, mixing the proportions of these two compounds in the MCT allows bandgap tuning between 0 and 1.5 eV, for example. This makes the MCT material unique in that it can react to absorption of infrared radiation in a large spectral range, including both of the accessible atmospheric windows from 3 to 5 μm (the mid-wave infrared window, MWIR), and from 8 to 12 μm (the long-wave window, LWIR). By way of example, detection in the MWIR window may obtained by using 30% cadmium (i.e., $(Hg_{0.7}Cd_{0.3})Te$; whereas detection in the LWIR window may be obtained by using 20% cadmium (i.e. $(Hg_{0.8}Cd_{0.2})Te$. The MCT material also may be capable of detecting in the short-wave infrared SWIR atmospheric windows of 2.2 to 2.4 μm and 1.5 to 1.8 μm. The MCT material may be p-type or n-type depending on the dopant used in the MCT. For example, arsenic may be used for p-type doping and indium may be used for n-type. In the illustrated embodiment, the MCT material used in the photoconductor layer 14 is an n-type material.

Although MCT has advantageous optical absorption properties, one problem with MCT is that it is a temperature-sensitive material with a relatively low thermal degradation temperature, which makes it susceptible to the processing conditions for making the photodetector 10. For example, the thermal degradation temperature of MCT is in the range from about 120° C. to about 150° C. (such as 120° C., 130° C., 140° C. or 150° C., including all ranges and subranges between the stated values). Within this temperature range, the mercury in the MCT compound will begin to diffuse out of the material. Because mercury affects the doping of the MCT material (n-type or p-type), the diffusion of mercury can affect MCT performance by changing the type of semiconductor of the MCT material (e.g., change from p-type to n-type or vice versa). Diffusion of mercury also can affect other layers in the device 10, such as the passivation layer(s) (described below). Accordingly, sustained exposure to temperatures within the thermal degradation temperature range or higher can influence the MCT bulk material properties, p-n junction integrity, and the passivant-MCT interface (described below). Thus, each step of the process in making the semiconductor device 10 during and after formation of the MCT photoconductor layer 14 should be kept below the MCT thermal degradation temperature to prevent degradation of the MCT. In addition, MCT is a relatively soft material due to the weak bond mercury forms with tellurium. By way of example, $Hg_{0.5}Cd_{0.5}Te$ may have a Mohs hardness of about 4. Moreover, the MCT is a relatively weak material that is susceptible to breakage or loss of adhesion with adjacent layers if the device 10 bows too much during processing. The relative weakness of MCT also makes it susceptible to defects if there is a large coefficient of thermal expansion (CTE) mismatch with adjacent layers in the device. Any semiconductor crystal defects in the MCT, such as at the interface with another layer, can affect performance of the MCT (e.g., forming charge trap sites, and the like). Therefore, as described in further detail below, it is advantageous to form the aluminum nitride (AlN) tensile layer 16 at relatively low temperatures to prevent degradation of the MCT and to control the amount of substrate bow.

Still referring to FIG. 2A, following the formation of the photoconductor layer 14, at least one passivation layer 24 is formed atop the photoconductor layer 14. In the illustrated embodiment, at least one of the passivation layers 24 is CdTe. In addition, as shown in the illustrated embodiment, the stress buffer layer 26 is formed overlying the photoconductor layer, and more particularly overlies at least a portion of the passivation layer(s) 24. In the illustrated embodiment, the stress buffer layer 26 is an aluminum nitride layer. The details of the stress buffer layer 26 will be described in further detail below. As shown, an opening 27 is formed in the passivation layer(s) 24 and the stress buffer layer 26 and a p-type implant 28 is formed below the opening 27 in the MCT photoconductor layer 14 to form the p-n junction with the n-type MCT layer 14. Alternatively, if the MCT is a p-type semiconductor, then the implant 28 will be an n-type implant. A metal contact 30 is formed in the opening 27 to contact the p-type implant 28 and protrude above the upper surface of the stress buffer layer 26.

Figure 2B:
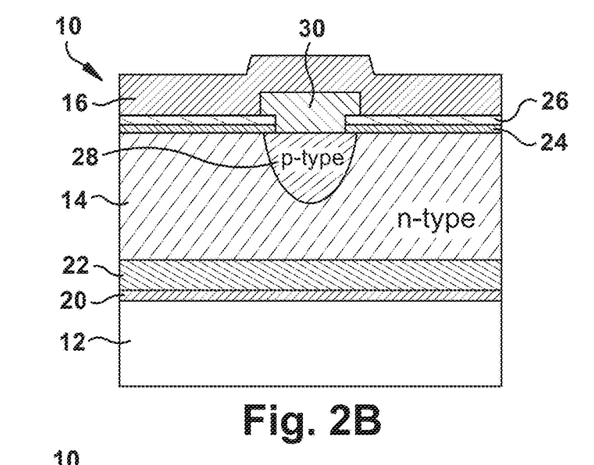

Referring to FIG. 2B, the stress compensation layer 16 is formed overlying the substrate 12. In the illustrated embodiment, stress compensation layer 16 is an aluminum nitride tensile layer 16 formed directly onto the stress buffer layer 26 (also $AlN_x$ in the illustrated embodiment). The AlN stress buffer layer 16 (also referred to herein as aluminum nitride layer 16 or tensile layer 16) also directly overlies the metal contact 30. As shown, the aluminum nitride layer 16 may overly an entirety of the major face of the substrate 12. In exemplary embodiments, the aluminum nitride layer 16 is formed with a low-temperature process below the thermal degradation temperature of any temperature-sensitive materials contained in the electrical device 10 prior to forming the aluminum nitride layer 16. For example, in the photodetector 10 containing the temperature-sensitive MCT photoconductor layer 14, the aluminum nitride layer 16 is formed at a temperature below 150° C. (i.e., the thermal degradation temperature of MCT), such as in the range from about 25° C. to about 150° C. (e.g., 25° C., 50° C., 75° C., 85° C., 90° C., 100° C., 125° C., 140° C., or 150° C., including all ranges and subranges between the stated values). In preferred embodiments where MCT is used, the aluminum nitride layer 16 is formed at a temperature from about 80° C. to about 110° C. to provide a cushion with the MCT thermal degradation temperature. In addition, the aluminum nitride layer 16 is formed with a suitable thickness and structure that counteracts the compressive forces of the compressive layer 18, as described in further detail below. An exemplary low-temperature process for forming the aluminum nitride layer 16 is described below, particularly with reference to FIGS. 3-5.

Figure 2C:
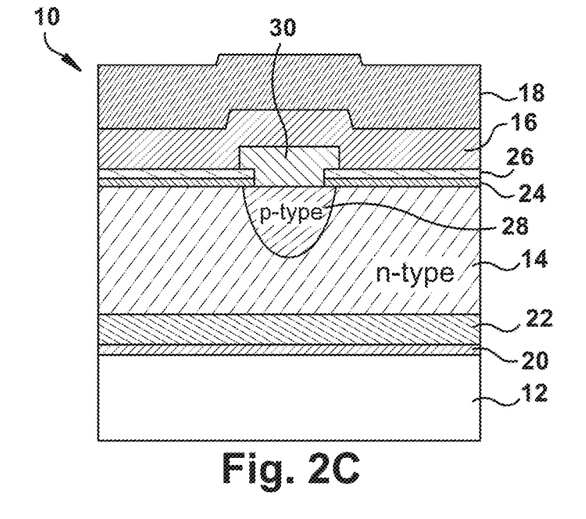

Referring to FIG. 2C, the compressive layer 18 (e.g., bonding layer) is formed overlying the substrate 12. In exemplary embodiments, the compressive layer 18 is formed to overly the aluminum nitride tensile layer 16, such that the aluminum nitride layer 16 is between the compressive layer 18 and the substrate 12, and more particularly between the compressive layer 18 and photoconductor layer 14. In the illustrated embodiment, the compressive layer 18 is formed directly on (in direct contact with) the aluminum nitride tensile layer 16 such the counteracting stresses between these layers 16, 18 are transmitted across the interface between these layers 16, 18. This enables most of the stress energy of the balancing film stack to be stored at the AlN/compressive layer (e.g., $SiO_x$) interface, rather than in the substrate 12. More specifically, the lateral strain induced by the tensile layer 16 and compressive layer 18 may be focused at the interface between said layers, and the tensile strain of the first tensile AlN layer 16 may be focused at the interface between the first tensile AlN layer and its interface with stress buffer layer 26, which may be formed of a rigid material of neutral residual strain, such that the initial lateral strain of the first tensile AlN layer 16 is displaced away from the interface between the MCT layer 14 and its passivation layers.

In exemplary embodiments, the compressive layer 18 is formed as a bonding layer to facilitate 3D-integration via hybrid bonding of the semiconductor device 10 (e.g., photodetector 10) to another electrical device (e.g., readout IC 70, shown in FIGS. 2G and 2H). The bonding layer (also referred to with reference numeral 18) may be a conformal dielectric film. The bonding layer 18 may be a non-metallic material, such as an oxide, more particularly a silicon oxide ($SiO_x$), for example silicon dioxide (e.g., fused silica or $SiO_2$). The aluminum nitride tensile layer 16 exhibits good adhesion with silicon oxide, and thus preferably no intermediate layer is needed between the layers 16, 18 when silicon oxide is chosen as the compressive layer 18. The compressive layer 18 may be formed by any suitable technique, such as a deposition process, including physical vapor deposition, chemical vapor deposition, plasma enhanced chemical vapor deposition, sputtering, or a spin-on glass process, provided that the process used can provide the required layer without exceeding the temperature limits of the other materials in the device. In exemplary embodiments, the compressive layer 18 may be deposited by a PVD to form the compressive/bonding layer 18 as described in further detail below.

As discussed above, the aluminum nitride tensile layer 16 and the compressive layer 18 are each formed with a suitable thickness and structure that enables counterbalancing of the stresses (tensile and compressive) of the respective layers 16 and 18 to thereby control an amount of bow of the substrate 12. For example, the aluminum nitride layer 16 may be formed to have a tensile stress in the range from about +50 MPa to about +1 GPa (such as +50 MPa, +100 MPa, +200 MPa, +300 MPa, +400 MPa, +500 MPa, +750 MPa, or +1 GPa, including all ranges and subranges between the stated values). In exemplary embodiments, the tensile stress provided by the aluminum nitride layer 16 is an intrinsic stress value of the material, as opposed to a stress value that arises by virtue of coefficient of thermal expansion (CTE) mismatches upon formation and cooling of the layer. The compressive layer 18, such as $SiO_x$, may have an intrinsic compressive stress value in the range from about −120 MPa to about −1 GPa (such as −120 MPa, −150 MPa, −200 MPa, −250 MPa, −300 MPa, −500 MPa, −750 MPa, or −1 GPa, including all ranges and subranges between the stated values). In exemplary embodiments, the aluminum nitride layer may by itself generate a negative bow in the substrate in the range from about −20 µm to about −300 µm for every 1 µm of thickness of AlN (such as −20 µm, −50 µm, −100 µm, −150 µm, −200 µm, −250 µm, or −300 µm, including all ranges and subranges between the stated values). The compressive layer 18, such as $SiO_x$, may by itself generate a positive bow in the substrate in the range from of about +20 µm to about 300 µm for every 1 µm of thickness of $SiO_x$ (such as +20 µm, +50 µm, +100 µm, +150 µm, +200 µm, +250 µm, or +300 µm, including all ranges and subranges between the stated values). The thicknesses of the aluminum nitride layer 16 and compressive layer 18 may be balanced to achieve the desired amount of bow to the substrate 12. For example, the aluminum nitride layer 16 may have a thickness in the range from about 3,000 Angstroms to about 1.5 µm (microns), such as about 7,000 Angstroms to about 12,000 Angstroms, more preferably about 9,000 to about 10,000 Angstroms (1 micron). The compressive layer 18 (e.g., $SiO_x$) may have a thickness of about 5,000 Angstroms to about 3.0 microns, such as about 8,000 Angstroms to about 12,000 Angstroms, more preferably about 11,000 Angstroms (1.1 microns) in some embodiments.

By way of a non-limiting example, in a first experiment an aluminum nitride layer ($AlN_x$, also referred to herein simply as AlN) is deposited on a 200 mm silicon prime wafer without additional layers. The thickness of the AlN layer is 1.0 micron, and the silicon wafer exhibits a bow of −50 microns. In a second experiment, a silicon oxide ($SiO_x$) layer is deposited on a 200 mm silicon prime wafer without additional layers. The thickness of the $SiO_x$ layer is 1.1 microns, and the silicon wafer exhibits a bow of +80 microns. In a third experiment, an aluminum nitride ($AlN_x$) tensile layer and a silicon oxide ($SiO_x$) compressive layer are deposited in-situ. The aluminum nitride tensile layer is deposited first on a 200 mm silicon wafer. The thickness of the AlN layer is 1.0 micron, and the silicon wafer exhibits a bow of −50 microns (as in the first experiment). The $SiO_x$ is deposited atop the AlN layer, with a thickness of the $SiO_x$ being 1.1 microns. The resulting bow of the wafer is −7 microns total. Because individual depositions of the respective layers in the first two experiments exhibited a bow for AlN of −50 microns and for $SiO_x$ +80 microns, this intuitively suggests a sum of +30 microns. However, in the third experiment it is believed that the first AlN layer increases the stiffness and reduces the resulting bow of the subsequent $SiO_x$ layer. Additionally, it may be assumed that the AlN surface may change the nucleation of the $SiO_x$ layer, resulting in a change to its average intrinsic stress.

In exemplary embodiments, preferred thicknesses of the aluminum nitride layer 16 and silicon oxide compressive layer 18 may be similar to the results of the first experiment, but a variety of thickness/stress combinations could result in the same net bow. Generally, to facilitate hybrid bonding, a preferred $SiO_x$ thickness is 1.0 microns, which gives about +80 microns of bow at about −200 MPa residual stress. Such a thickness of $SiO_x$ could be counterbalanced by an AlN underlayer having intrinsic stress/thickness ratios of +200 MPa/0.75 µm, +100 MPa/1.2 µm, or +300 MPa/0.5 µm, for example. It is understood that although the aluminum nitride layer 16 and compressive (e.g., $SiO_x$) layers are shown as individual layers that form a bilayer anti-deflection stack, more than one of each of these layers may be formed in the device. For example, the balancing stack of the AlN—$SiO_x$ bilayer may be repeated in an alternating pattern if desired to achieve the desired thickness(es) of the layers and/or bow of the substrate 12. Additionally, changes to the deposition process used for the AlN layer may create subtle changes in its surface that cause the $SiO_x$ layer to deposit with lower or higher average stress.

It is understood by those familiar with the art that the average stress in a deposited layer may vary from bottom to top, i.e., a film may have a stress gradient through its thickness. We only refer to the average stress of the total deposited film, knowing that a film 1.0 microns thick may have an average stress of, for example +10 MPa, but if its deposition were to be terminated after only 0.1 microns, it may have a different average total stress magnitude and sign, perhaps −10 MPa.

Figure 3:
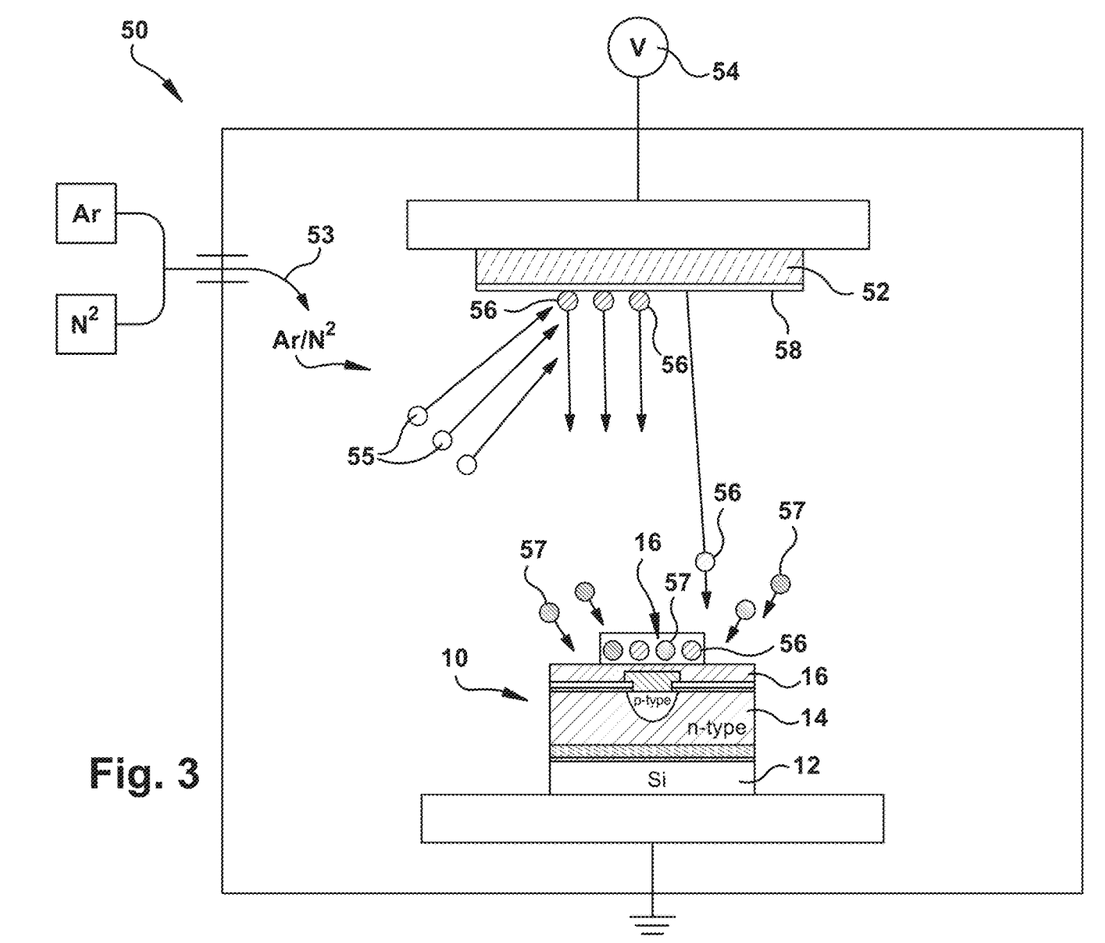
FIG. 3 is a schematic diagram of an exemplary physical vapor deposition process for forming an exemplary aluminum nitride tensile layer during processing of the semiconductor device.
Figure 4:
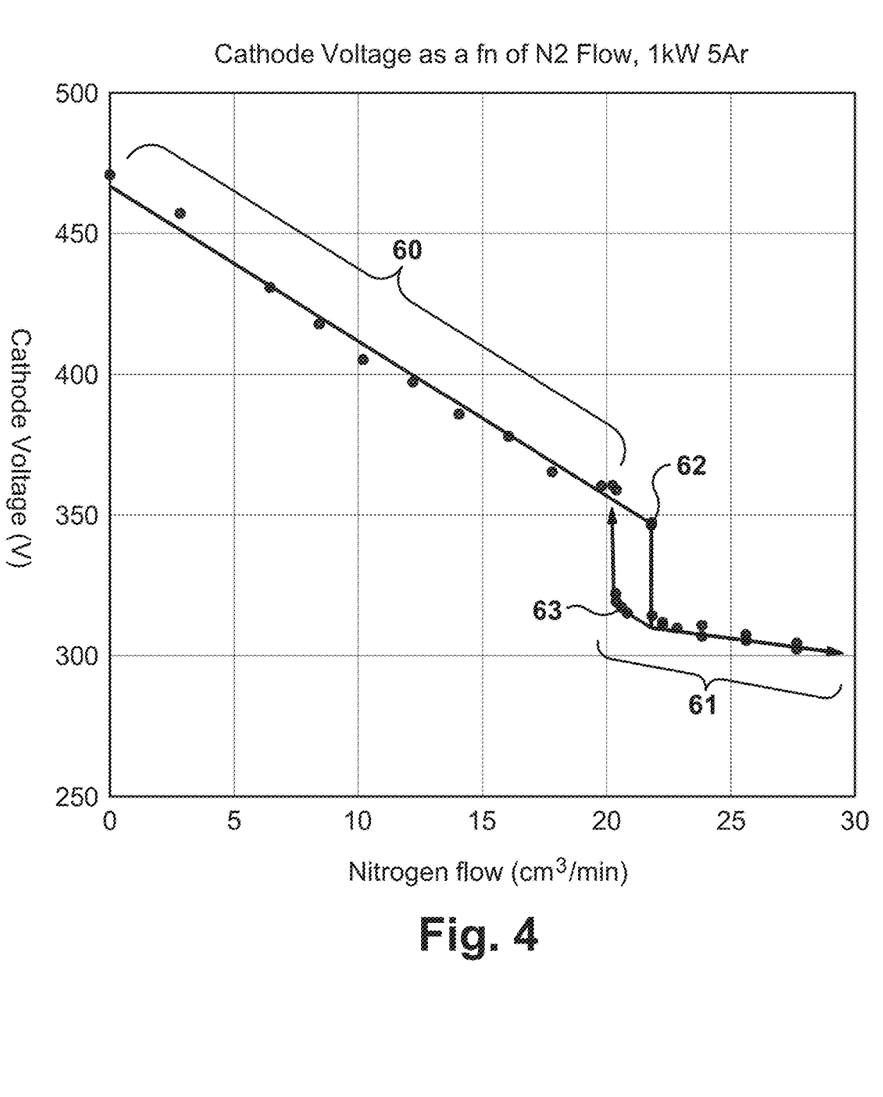
FIG. 4 is a hysteresis diagram showing cathode voltage versus nitrogen flow during physical vapor deposition of the aluminum nitride tensile layer.
Figure 5:
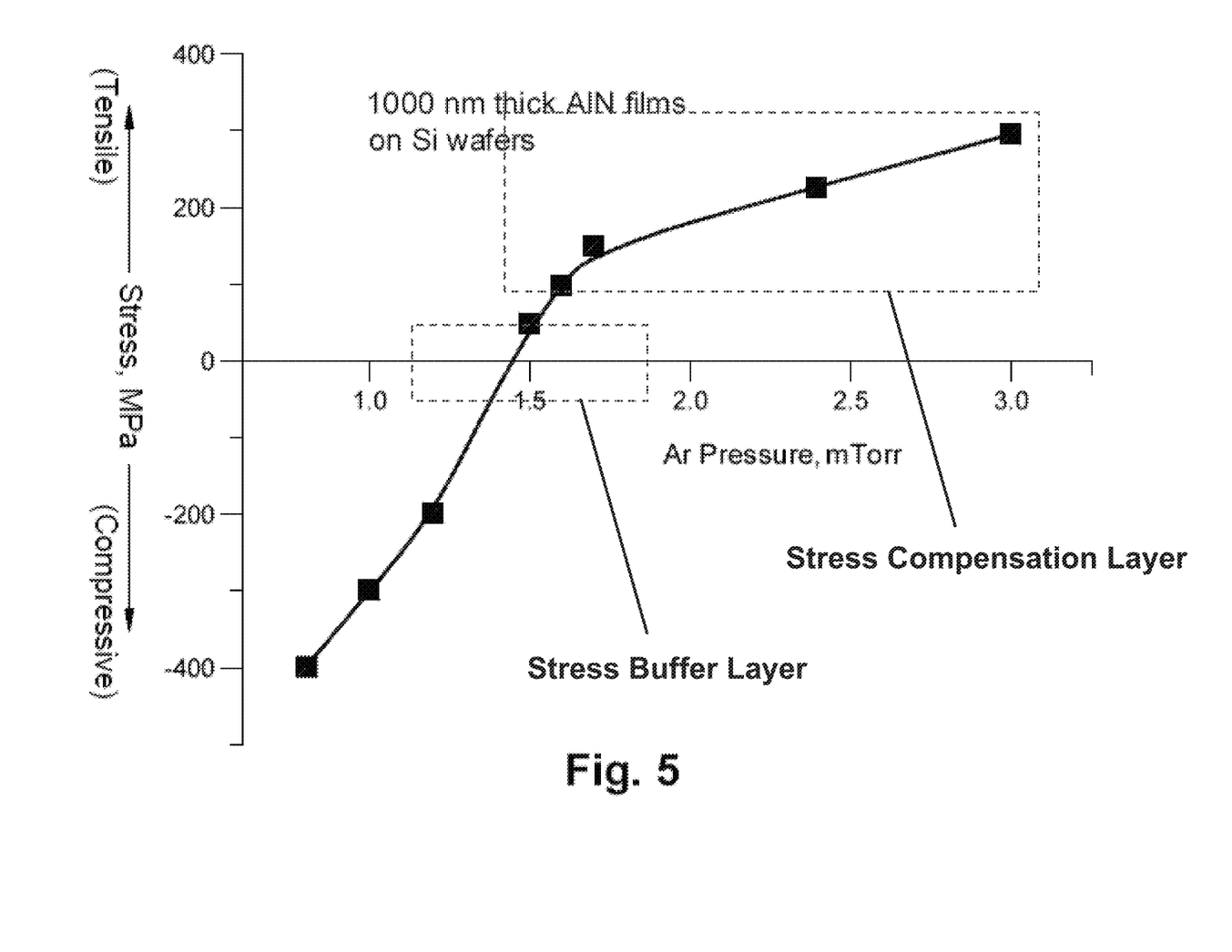
FIG. 5 is a diagram showing the intrinsic tensile stress of a deposited aluminum nitride layer as a function of argon (Ar) pressure during physical vapor deposition.

Referring to FIGS. 3-5, an exemplary process for forming the aluminum nitride layer 16 is shown. In exemplary embodiments, the aluminum nitride layer 16 is formed on the semiconductor device 10 via a PVD reactive sputtering process in a PVD vacuum chamber 50. As shown, the sputtering target 52 is an aluminum (or aluminum alloy) target and the sputtering gas 53 comprises argon (or other inert gas) and a nitrogen (reactive) gas. Generally, a negative charge is applied to the target 52 via a power source 54, and high-velocity argon ions 55 are accelerated into the negatively charged target 52 to liberate the aluminum atoms 56 from the target 52 which are directed toward the device 10. At the deposit surface of the device 10, the aluminum atoms 56 react with the nitrogen atoms 57 at the surface to form the aluminum nitride layer 16. As discussed above, the temperature of the AlN film formation process is controlled so that the device 10 (and particularly the temperature-sensitive material 14) does not exceed the thermal degradation temperature of the temperature-sensitive material 14. For example, where MCT is used, the temperature of AlN film formation is controlled to below 150° C., and more preferably does not exceed 125° C. Temperature may be monitored by temperature dots or other suitable sensors in a manner well-known in the art.

In exemplary embodiments, the target 52 is poisoned to have an altered aluminum nitride layer 58 at its surface that is liberated from the surface during sputtering. This sputtered aluminum nitride is partially or completely dissociated by bombardment with the high energy argon ions 55, such that the aluminum atoms 56 arrive at the reaction surface of the device 10 to react with the nitrogen atoms 57 in the process chamber atmosphere to form the AlN layer 16.

Referring to FIG. 4, shown is an exemplary hysteresis curve of cathode voltage (in volts) as a function of nitrogen ($N_2$) flow ($cm^3$/min) at a constant cathode power of 1 kW and a constant Argon flow of 5 standard cubic centimeters per minute (sccm). The hysteresis curve shows a drop in voltage of the target from a "metal mode" (region 60) to a "compound mode" (region 61) as the target poisons. More specifically, under constant power control, as $N_2$ flow is increased relative to the amount of argon, the sputter cathode voltage steadily drops as cathode current increases. At the "collapse flow" point 62, the target surface becomes poisoned and completely covered by the altered layer of $AlN_x$, and cathode voltage steps down by about 10%. From this point, the altered layer can be removed by reducing $N_2$ flow to the "recovery flow" point 63. It is understood that other cathode powers, flow rates, etc. may be utilized which would provide essentially the same hysteresis curve, and thus the units on the Y-axis for cathode voltage and X-axis for nitrogen amount may be arbitrary, but to achieve the desired AlN film the nitrogen flow may be maintained so that the process occurs at or above the collapse flow point 62.

Generally, the present inventors have found that AlN films deposited in the "metal mode" portion of the Al—N hysteresis curve are characterized by high deposition rate (about 700 Angstroms per kW-minute), which forms a brown-colored, non-stoichiometric film of $AlN_x$, where x<1. On the other hand, the "compound mode" portion of the Al—N hysteresis curve is characterized by low deposition rate (about 70 Å per kW-minute to about 150 Å per kilowatt-minute (such as 70 Å/kW-min, 90 Å/kW-min, 115 Å/kW-min, 125 Å/kW-min, or 150 Å/kW-min, including all ranges and subranges between the stated values). This "compound mode" deposition forms a stoichiometric or near-stoichiometric film of $AlN_x$, where $0.9<x<1.1$ (such as x=1). These films are blue-colored and have an index of refraction of 2.01 to 2.03, as measured by ellipsometry.

In exemplary embodiments, the stoichiometric or near-stoichiometric $AlN_x$ film that is formed via the "compound mode" is a preferred form of the aluminum nitride tensile layer 16 for exemplary semiconductors 10. Such formation of the aluminum nitride tensile layer 16 may provide a vapor deposited (i.e., non-epitaxially grown) polycrystalline film having one or more desirable properties including low processing temperature, an intrinsic tensile stress, and/or an intrinsic bow for counterbalancing the stress and/or bow of the compressive oxide layer. For example, the vapor deposited polycrystalline aluminum nitride layer may have an intrinsic tensile stress in the range from +50 MPa to +1 GPa (such as 50 MPa, 100 MPa, 200 MPa, 300 MPa, 400 MPa, 500 MPa, 750 MPa, or 1 GPa, including all ranges and subranges between the stated values). Such an aluminum nitride layer may generate a negative bow in a 200 mm silicon substrate in the range from −20 μm to −300 μm for every 1 μm of thickness of AlN, such as a −50 μm bow as described above in the first experiment. Such deposited AlN films may have 50-80% of the bulk AlN thermal conductivity (about 285 W/m-k), and a low frequency dielectric constant with a range from about 4 to about 9. The coefficient of thermal expansion (CTE) of such an AlN layer may be from $4.6\times10^{-6}$/K to $5.5\times10^{-6}$/K.

It is understood that AlN tensile film stress in the "compound mode" may be varied from tensile to compressive without adversely affecting uniformity and overall quality (i.e., adhesion, stoichiometry, and density), as may be desirable for a particular application as would be understood by those having ordinary skill in the art. For example, referring to FIG. 5, shown is a plot of AlN stress versus argon pressure for 1,000 nm thick AlN films deposited on silicon wafers in a "compound mode." As shown in the plot, the argon pressure may be increased or decreased to affect the stress of the AlN layer between compressive and tensile as desired. It is understood that the depiction in FIG. 5 is exemplary, and that the stress-pressure curve may be offset along the X-axis based upon the processing parameters, such as cathode power for example.

In exemplary embodiments, the target material for vapor depositing the AlN tensile layer 16 may include pure Al or aluminum alloy (Al and 0.4 wt. % Ti doping, for example). It is conceivable, however, that Al targets with other dopants could be used to manipulate stress, dielectric constant, charge trapping, or smoothness of the deposited AlN layer. In exemplary embodiments, the deposition rate of the AlN tensile layer 16 typically is about 125 Angstroms per kilowatt-minute at a constant cathode power of about 4 kW. It is understood, however, that the voltage, partial pressures, deposition rate, etc. may varied as may be desirable to vary the structure, tensile behavior, adhesion, strength, etc. of the AlN layer as would be understood by those having ordinary skill in the art.

Turning now to the stress buffer layer 26, and while still referring to FIG. 5, it is apparent that essentially the same process steps used for forming the AlN stress compensation layer 16, but with a change to the argon (Ar) pressure during deposition, may be used to achieve the neutral residual (intrinsic) stress state of the stress buffer layer 26. Generally, the AlN stress buffer layer 26 is configured to protect the fragile MCT photoconductor layer 14 from damage by creating a low-stress interface between the photoconductor layer 14 and the elevated compressive stress bonding layer 18. For example, the stress buffer layer may have a residual stress in a range from, more particularly in a range from −50 MPa to +50 MPa, such as about −50, −40, −30, −20, −10, 0, +10, +20, +30, +40, or +50 MPa (including all values and subranges between the stated values). Most preferably within the range from −10 MPa to +10 MPa intrinsic stress.

The AlN stress buffer layer 26 is a good dielectric capable of uniform deposition and which provides a relatively rigid layer. Generally, the AlN stress buffer layer 26 should be rigid enough not to transfer the interface strain generated by the compressive bonding layer 18 to the underlying MCT layer 14 interface. In addition, the AlN stress buffer layer 26 has a CTE that is close to that of the MCT photoconductor layer 14, such that stress buffer layer can reduce or eliminate strain at the interface to the fragile layer during processing and after cooling to room temperature, or during low-temperature operation. For example, the AlN stress buffer layer 26 has a CTE of about $4.6\times10^{-6}$/K to about $5.5\times10^{-6}$/K and the MCT layer has a CTE of about $5.0\times10^{-6}$/K to about $5.6\times10^{-6}$/K. The same or similar CTE of the AlN stress compensation layer 16 also reduces or eliminates interfacial strain at fabrication or operating temperatures. Moreover, simply modifying the processing parameters (Ar pressure, for example) to create different AlN layers with different residual stresses for providing the stress buffer layer 26 adjacent to the stress compensation layer 16 improves manufacturability of the device.

Referring back to FIG. 2C, the compressive layer 18 also may be formed via PVD. In the case of $SiO_x$, a "metal mode" reactive PVD process may be used with a suitable target and environment to deposit the compressive layer to a final pre-specified thickness. In exemplary embodiments, following PVD of the aluminum nitride layer 16, the subassembly of the device 10 may then be passed under vacuum to a second PVD module where the compressive layer 18 (e.g., $SiO_x$ layer with about −180 MPa compressive stress, for example) is deposited. The $SiO_x$ layer may have an intrinsic compressive stress value in a range from −150 MPa to −400 MPa. The $SiO_x$ layer may have a CTE in a range from $0.6 \times 10^{-6}$/K to $3.5 \times 10^{-6}$/K.

As discussed above, the aluminum nitride tensile layer 16 and the compressive layer 18 are configured to counterbalance each other to thereby control an amount of bow of the substrate 12. In exemplary embodiments, the final amount of substrate bow following deposition of the compressive layer 18 (e.g., $SiO_x$) may be in the range from 10 μm to 30 μm positive bow. This facilitates later chemical mechanical polishing (CMP) in which the amount of bow will then be reduced, and bonding in which a small positive bow enhances bonding quality. Alternatively, the layers 16, 18 may be configured to cooperate with each other to keep the substrate from bowing, or to create a negative bow.

Figure 2D:
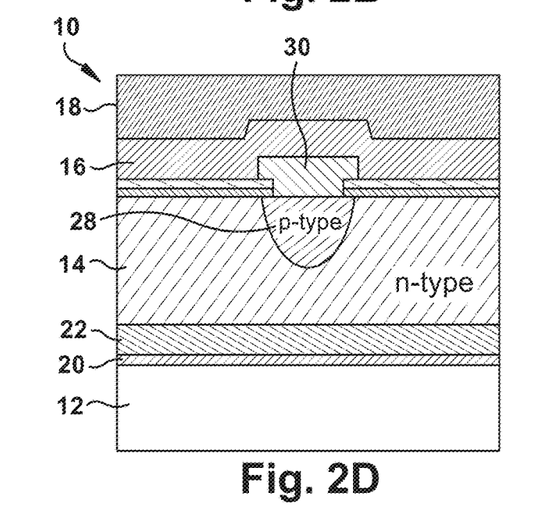

Referring to FIG. 2D, after forming the compressive layer 18 (e.g., $SiO_x$), the upper layer of the compressive layer 18 may be planarized via chemical mechanical polishing or other removal techniques to prepare the surface for forming one or more interconnects in the structure of the device 10.

Figure 2E:
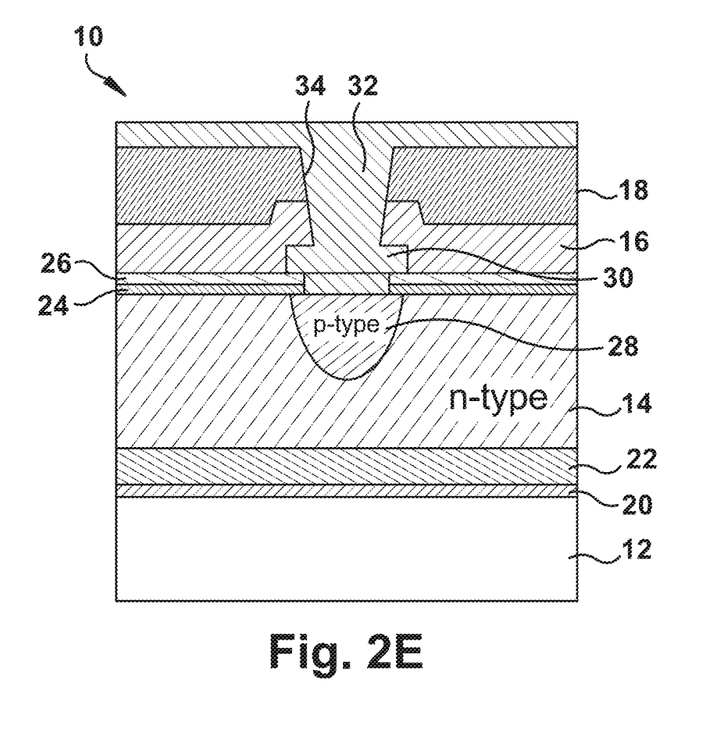

Referring to FIG. 2E, one or more interconnects 32 are formed in the semiconductor device 10 to make electrical connection with the metal contact(s) 30. In exemplary embodiments, to form the interconnect 32, a via hole 34 may be formed through the compressive layer 18 and the aluminum nitride layer 16 to reach an upper surface of the metal contact 30. The via hole 34 may be formed through the layers 16, 18 in any suitable manner as would be understood by those having ordinary skill in the art. For example, a photoresist layer may be deposited along at least a portion of the upper surface of the compressive layer 18. The photoresist layer may be deposited according to conventional methods well known in the art, for example by spin coating, to produce a relatively uniform layer. The via hole 34 (also referred to as channel, cavity, or the like) may be formed in the photoresist layer and compressive layer 18 using conventional photolithographic patterning and/or etching techniques. For example, a photomask having the desired pattern for forming the via hole(s) 34 may be placed over the photoresist layer, and UV light may be directed through the mask holes to expose those portions of the photoresist layer corresponding to the via hole(s) 34. Thereafter, the photoresist layer may be developed in a conventional manner to remove those portions of the photoresist layer exposed to the UV light, whereby the via hole(s) 34 may be formed.

Following formation of the via hole 34, the interconnect 32 may then be formed in the via hole by any suitable technique. For example, the interconnect 32 may be deposited by electroplating. Other suitable techniques may include: electrochemical deposition, evaporation, or metalorganic chemical vapor deposition, for example. The interconnect may be made of any suitable electrically conductive material or combination of materials. For example, the interconnect 32 may be made from nickel, copper, indium, highly-doped silicon, rhenium trioxide ($ReO_3$) or hybrid combinations of two or three of these conductive materials in order to tailor the CTE of the interconnect and reduce strain on the contact due to CTE mismatch. Other interconnect configurations developed by the present applicant also can be utilized in the electrical device structure described herein, including, but not limited to, that described in U.S. application Ser. No. 17/190,850 filed Mar. 3, 2021, which is incorporated herein by reference.

Figure 2F:
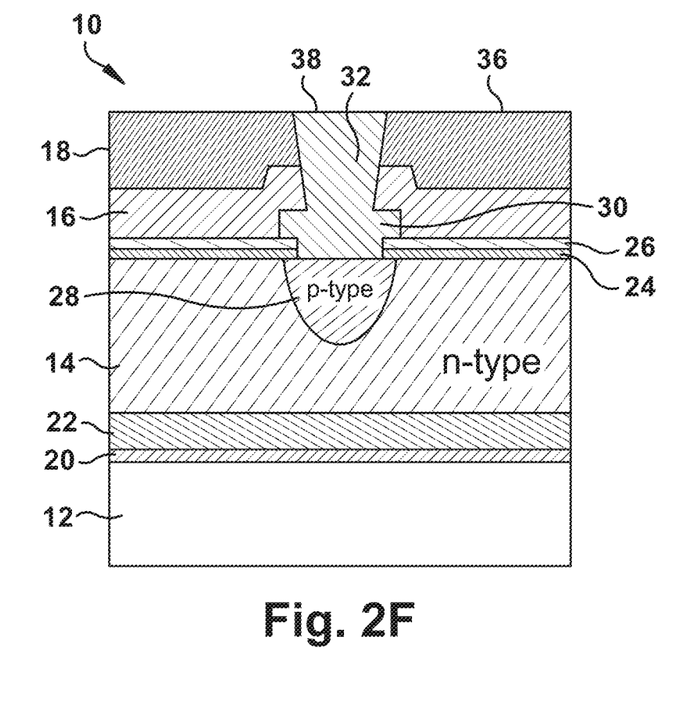
Figure 2G:
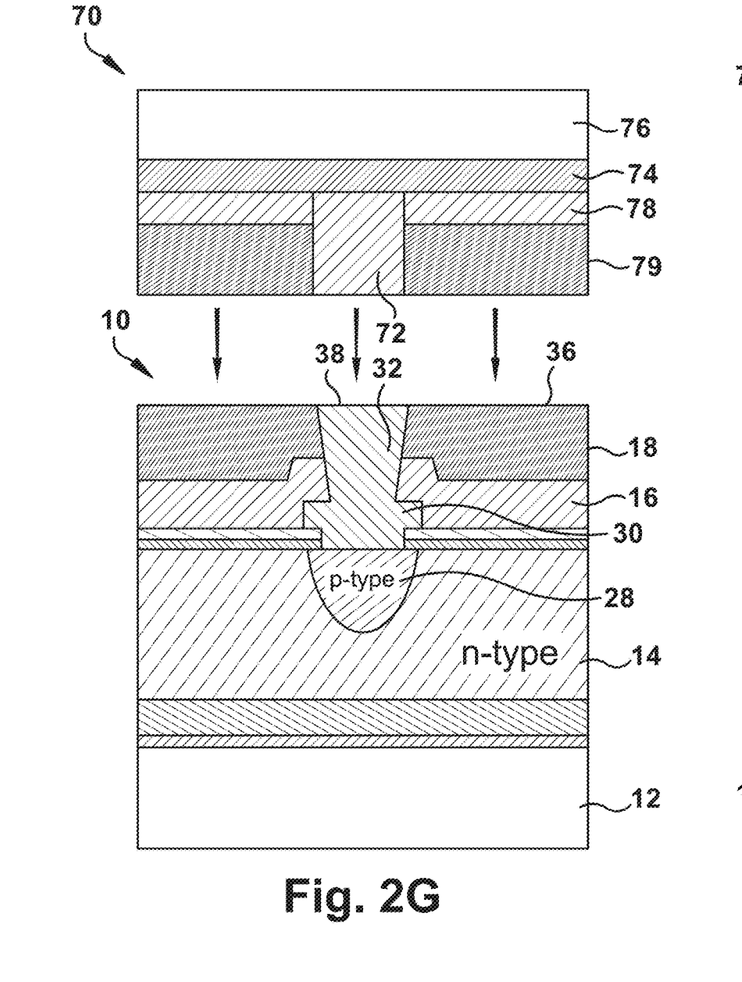
FIGS. 2G and 2H are schematic cross-sectional views depicting an exemplary process of hybrid bonding the exemplary semiconductor device in FIG. 2F to another exemplary electronic device.
Figure 2H:
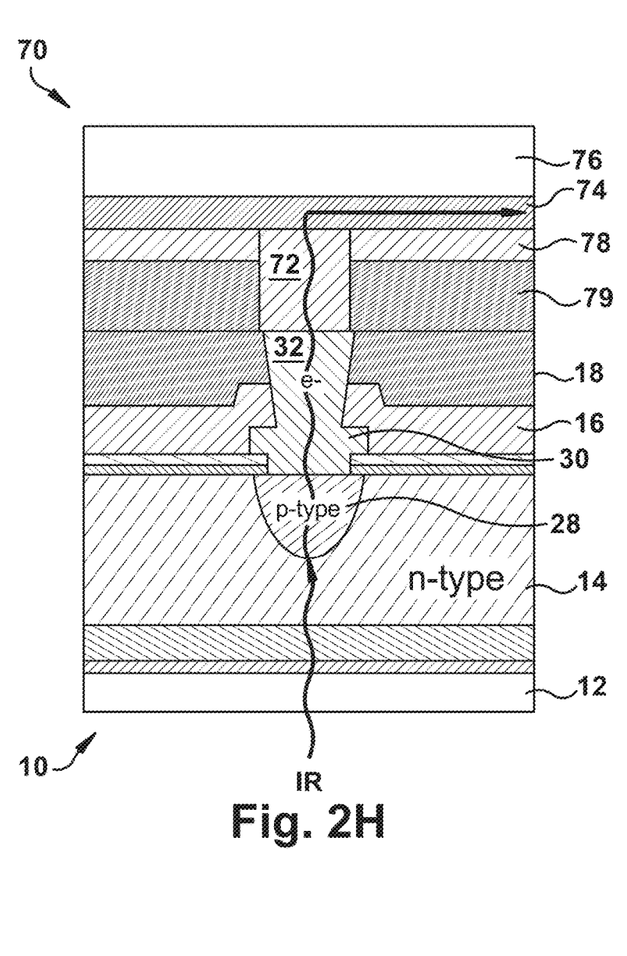

Referring to FIGS. 2E and 2F, following formation of the interconnect 32, the upper surface of the compressive layer 18 may contain overlapping excess material from the interconnect formation. In FIG. 2F, a CMP process is used to remove the excess material and to planarize the upper surface 36 of the compressive layer 18 (e.g., $SiO_x$ bonding layer 18), such as for preparation in hybrid bonding to another electrical device, such as ROIC 70 (FIG. 2H). During this pre-bond CMP process, some additional bow of the substrate 12 may be reduced or eliminated. It may be desirable to have a slight bow, such as about 10 microns or less to further facilitate hybrid bonding.

The CMP removal process also may expose outwardly addressable face(s) 38 of the interconnect(s) 32 in preparation for fusion bonding to corresponding interconnects 72 the other electrical device 70 (FIG. 2G). As shown in the illustrated embodiment, the compressive layer 18 and interconnect 32 have been polished to have respective upper surfaces that are coplanar with each other. The height of the interconnect 32 relative to the upper major surface of the substrate 12 may also be controlled with the polishing process. The CMP process typically has a number of process variables including but not limited to the type of polishing slurry, rate of slurry addition, polishing pad, polishing pad rotation rate, and polishing pressure. The material used for the interconnect 32 and/or type of material for the compressive layer 18 may further affect the CMP process. These variables may be optimized to control the height of interconnect 32 and compressive layer 18 relative to the upper surface of the substrate 12, and may also be optimized to provide optimal surface roughness for the upper surface 36 of the compressive layer 18 and/or the addressable faces 38 of the interconnects 32.

Referring to FIGS. 2G and 2H, after the upper surfaces of the compressive (bonding) layer 18 and interconnects 32 have been prepared, the exemplary semiconductor device 10 may be ready to be vertically stacked and hybrid bonded with another electrical device 70. In the illustrated embodiment, where the semiconductor device 10 is a photodetector 10, the other electrical device 70 may be a readout integrated circuit (ROIC) (also referred to with reference numeral 70). The ROIC 70 may be conventional or may be specially adapted for the semiconductor device 10. As shown in the example, the ROIC 70 may include at least one redistribution interconnect 72 in a via pattern complimentary to the at least one interconnect 32 of the device 10. The interconnect 72 may electrically connect to an electrical trace layer 74 overlying a substrate 76 to permit the electrical readout from the device 10. The ROIC 70 may include a tensile layer 78 and a compressive layer 79 to restrict and/or control bowing of the ROIC 70. In exemplary embodiments, the tensile layer 78 is an aluminum nitride layer, and the compressive layer 79 is a silicon oxide ($SiO_x$) bonding layer, which may be prepared in a similar manner as in the device 10.

As shown in FIG. 2H, during the initial contacting of the two electrical devices 10, 70 at room temperature, the respective interconnects 32, 72 are aligned, and at least a portion of each of the opposing surfaces of the devices 10, 70 may conform to each other by elastic deformation. Thereafter, hybrid bonding may occur between the opposing contact surfaces of each device 10, 70. In such process, at least a portion of each of the opposing bonding layers 18, 79 may bond together, and one or more of the opposing interconnects 32, 72 may be contacted or bond together to form an electrical interconnection between the adjoining electrical devices 10, 70, which thereby forms a 3D-integrated (e.g., vertically stacked) electrical assembly. Generally, such hybrid bonding refers to forming the direct oxide bond and the thermo-compressive bond between interconnects simultaneously; whereas direct bonding generally refers to bonding oxide layers together directly using no additional materials; and whereas thermo-compressive bonding alone generally refers to bonding metallic layers together using a combination of pressure and heat.

More specifically, as the opposing bonding layers 18, 79 contact at room temperature, the contacting (e.g., $SiO_x$) regions of the bonding layer may begin to form a bond at the contact point or points. The attractive bonding force between the electrical devices 10, 70 increases as the contact bonding area increases. A chemical bond may develop between the opposing surfaces of each bonding layer 18, 79, which may be a covalent bond that reacts across surface elements to form a high bond strength that approaches, for instance, the fracture strength of the electrical device materials. The formation of the chemical bond between bonding layers 18, 79 may be accelerated by a temperature treatment, for example, a low-temperature treatment of between about 50° C. to about 250° C. (such as 50° C., 100° C., 125° C., 150° C., 175° C., 200° C., or 250° C., including all ranges and subranges between the stated values), and more preferably less than the thermal degradation temperature of materials in the devices 10, 79.

The interconnects 32, 72 may form a cold fusion bond at low temperatures (e.g., room temperature), or the fusion bond between interconnects 32, 72 may be accelerated by temperature treatment, such as the temperature treatment for the bonding layers 18, 79 described above. At these relatively low temperatures (e.g., 50° C. to 250° C.) the interconnect materials form reliable fusion bonds by way of interdiffusion between the contacting portions of the interconnects 32, 72. The ability to fusion bond the interconnects 32, 72 at the same time as bonding the bonding layers 18, 79 eliminates extra heating steps. It is understood, however, that the heating step for fusion bonding the interconnects 32, 72 may be performed after bonding of the bonding layers 18, 19. It is understood that the low-temperature treatment(s) may be carried out with a variety of heating methods, including but not limited to thermal, infrared, and inductive. Examples of thermal heating include vacuum annealing (using a heated substrate holder), backside infrared heating, oven, Rapid Thermal Processor, belt furnace, and hot plate. An example of infrared heating is rapid thermal annealing.

It is understood that although in this example the semiconductor device 10 is a photoconductor that is 3D-integrated with an ROIC, other semiconductor devices 10 may be coupled with other electrical devices 70. For example, the second electrical device 70 may be another semiconductor device of a different size, have a different function, or be made of different materials, all of which may be selected depending on the design considerations as understood by those having skill in the art. It is further understood that the exemplary semiconductor device 10 may be vertically stacked and hybrid bonded with a non-semiconductor device, or with other active or passive electrical devices.

Still referring to FIG. 2H, after the 3D-integration process is complete via hybrid bonding, the substrate 12 of the photodetector 10 may be ground or polished to reduce its thickness. In exemplary embodiments, the substrate 12 may be reduced to about 100 microns from its original thickness of about 750 microns, for example. The substrate 12 also is optically polished to reduce roughness. The reduction in thickness and optical polishing enables the substrate 12 to serve as a window for incident light detection by the photoconductor layer 14. As shown in the illustrated embodiment, an incoming photon (e.g., infrared photon) is transmitted through the substrate 12 and into the photoconductor layer 14 (e.g., MCT layer). As discussed above, an infrared photon of sufficient energy moves an electron from the valence band to the conduction band creating an electron-hole pair. The electron has sufficient mobility to be travel via the metal contact 30 and interconnects 32, 72 to be collected by the ROIC 70, where it is then transformed into an electrical signal for detecting the amount of IR radiation detected by the photodetector 10 in a manner well-known in the art. The ROIC 70 may have a multiplexer configuration, wherein each pixel of detection may have dedicated readout circuitry and photodetector 10. Other suitable circuitry may be used with the ROIC 70 for creating a suitable signal corresponding to the detected IR photon(s) by the photodetector 10 in a manner well-known in the art.

An exemplary electrical device utilizing a unique stress compensation layer and/or stress buffer layer arrangement, and method of making the same have been described herein. As discussed above, the exemplary aluminum nitride (also referred to interchangeably as $AlN_x$, or more simply AlN) deposition process may be configured to provide the AlN layer with an intrinsic tensile stress and/or intrinsic tensile bow to counteract compressive layer stress and/or bow to thereby control an amount of substrate bow in the device. In addition, the exemplary aluminum nitride (also referred to interchangeably as $AlN_x$, or more simply AlN) deposition process may be configured to provide the AlN layer with an essentially neutral stress to provide a rigid intermediate buffer layer that protects fragile materials in the device, such as MCT.

The exemplary AlN materials described herein may have numerous advantages for semiconductor devices. For example, such an AlN layer exhibits excellent adhesion and dielectric properties. The stress energy of the balancing film stack may be stored at the AlN/compressive layer (e.g., $SiO_x$) interface, rather than in the Si substrate. The AlN layer has very high thermal conductivity, making it a heat spreading layer that helps reduce thermal gradients or hot spots in operating devices. The coefficient of thermal expansion for AlN closely matches that of MCT, making it an excellent candidate for use with this unique material such as for use with sophisticated IR sensors or photodetectors.

As described above, an exemplary method for making the aluminum nitride tensile layer or the aluminum nitride stress buffer layer also includes numerous advantages for semiconductor devices. For example, the aluminum nitride layer may be formed at relatively low temperatures, particularly at a lower temperature than the thermal degradation temperature of any temperature-sensitive material(s) present in the semiconductor device at the time of formation, such as MCT used in photodetector devices. In the exemplary PVD reactive sputtering process, the use of an aluminum target provides improvements over susceptibility to cracking from thermal stress, so power and deposition rates can be adjusted upward, reducing cycle time. Aluminum targets also typically cost must less than other targets such as Si. The AlN film may have only +/−2% non-uniformity, making it a match for compressive $SiO_x$ bonding oxide films. The exemplary PVD process enables bonding dielectric stacks to be processed in a single run, without breaking vacuum to flip wafers and deposit back side compensation layers, greatly reducing cycle time and wafer handling at this step. The process enables a reduction in wafer handling and process time for CMP by eliminating the need to flip and polish both sides of the wafer, greatly reducing cycle time at this step. The process allows design flexibility and latitude by making the back side of the wafer available for thinning and use in device design (e.g., thinning the silicon substrate as a window for IR sensors/photodetectors).

Generally, the use of an aluminum nitride tensile layer in combination with a compressive bonding oxide layer in a semiconductor device may result in a net wafer bow that does not require the wafer's back side to be coated to compensate for the bonding oxide stress. The aluminum nitride tensile layer and/or compressive layer may adjusted such that the bow induced in the silicon wafer by the two layer stack is sufficiently and predictably low enough to enable subsequent processing without risk of mishandling or negative process impact due to excessive wafer bow.

While a preferred form of an exemplary semiconductor device 10 has been described above, it should be apparent to those skilled in the art that other electrical device designs could also be used with the present invention. The invention is not limited to any particular electrical device design, but rather is appropriate for a wide variety of electrical device designs.

For example, with 3D-integration techniques, it is generally advantageous to limit temperature and it is an advantage to have the high thermal conductivity of AlN imbedded in the wafers stack. The CTE differences between different substrate materials, such as Si and fused quartz, sapphire, InSb, etc., as well as the high CTE of metal features, can lead to physical damage, so many 3D integration schemes benefit from single-side bow compensation and low temperature. An example of another type of semiconductor that benefits from low temperature processing and from a CTE match with AlN is $Al_xGa_{(1-x)}As$, which has a CTE range between $4 \times 10^{-6}$/K and $6 \times 10^{-6}$/K, which matches well to AlN. Other materials in the II-VI and III-V semiconductor category may also match well to the coefficient of thermal expansion of AlN. The term substrate is not limited to these materials, and the substrate may include any layer or set of layers, including the MCT layer, for example.

It is furthermore understood that although a preferred location of the aluminum nitride tensile layer 16, compressive (bonding) layer 18 (e.g., $SiO_x$), aluminum nitride stress buffer layer 26, and temperature-sensitive material 14 have been described above, other suitable locations for these materials may be employed in an electrical device as may be desirable based on the particular application. These layers may underly or overly one another (directly or indirectly), may be located laterally or adjacently to one another (directly or indirectly), or may be located at any suitable location of the semiconductor device.

It is understood that the advantages of the exemplary aluminum nitride tensile layer or neutral stress buffer layer also may be applicable for other temperature-sensitive materials used in such electrical devices other than MCT described above. Such temperature-sensitive materials may have thermal degradation temperature of 300° C. or less for example, such as 250° C. or less, or more particularly 150° C. or less. For example, the thermal degradation temperature of such temperature-sensitive materials, and thus a temperature limit for formation of the AlN layer, may be in the range from 25° C. to 300° C., more particularly 50° C. to 250° C., more particularly 75° C. to 200° C., more particularly 75° C. to 150° C., more particularly 90° C. to 125° C., and more particularly about 100° C. (such as 25° C., 50° C., 75° C., 90° C., 100° C., 115° C., 125° C., 150° C., 175° C., 200° C., 225° C., 250° C., or 300° C., including all ranges and subranges between the stated values).

As used herein, the term thermal degradation temperature means the temperature at which the action of heat on a material causes a loss of properties such as physical, mechanical, and electrical properties. Such loss of properties by thermal degradation may be manifested by microstructural or compositional changes, time-dependent deformation and resultant damage accumulation, environmental attack and accelerating reactionary effects with the environment at elevated temperature, or the like. For example, the thermal degradation temperature may include a temperature at which thermal decomposition occurs, where a substance chemically decomposes (breaking of chemical bonds) into one or more constituent parts, or a temperature at which two or more components react to form a component that is undesirable. The thermal decomposition temperature also may include the melting temperature, glass transition temperature, eutectic formation temperature, boiling/volatilization temperature, or the like for such materials.

By way of non-limiting example, some exemplary temperature-sensitive materials and their thermal degradation temperature include the following: lead-tin (PbSn) having a eutectic melting temperature of 183° C.; bismuth lead tin (BiPbSn) having a melting temperature of about 95° C.); bismuth tin (BiSn) having a eutectic melting temperature of about 138° C.; indium tin (52% In: 48% Sn) having a melting temperature of about 119° C.; indium (In) having a melting point of about 157° C.; tin (Sn) having a melting point of about 230° C.; rubidium (Rb) having a melting point of about 40° C.; cadmium telluride (CdTe) or cadmium zinc telluride (CdZnTe) having a thermal degradation temperature of about 180° C.; mercury cadmium telluride ($Hg_{1-x}Cd_xTe$) having a thermal degradation temperature in the range from about 120° C. to about 150° C.

Moreover, although reference is made predominantly to MCT as the fragile material, it is understood that other fragile materials may be used at other regions in electrical devices, in which it may be desirable to provide a low-stress dielectric layer 16 that imparts little to no stress on the fragile material(s). Generally, the acceptable level of stress for the stress buffer layer may be relative to the amount of stress (force) this layer imparts on the fragile material(s). Generally, a "fragile material" is one having a Kc fracture toughness of less than 1 $MPa \cdot m^{1/2}$ by Vickers indentation testing. The "failure stress value" as used herein is commonly referred to as a "strength" of the material, which may include the yield strength, ultimate strength, rupture strength, fracture toughness, or the like, at which the underlying functionality of the material (e.g., mechanical and/or electrical properties) appreciably deteriorates or fails to perform. At least one method of determining the intrinsic stress value of the dielectric material 16 is to determine when the in-plane stress of the material exceeds the threading dislocation glide force, in which dislocations glide to reconfigure to the lowest strain energy.

It is understood that all ranges and ratio limits disclosed in the specification and claims may be combined in any manner, including all values, ranges and subranges between the stated values. The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values.

As used herein, positional or direction terms such as "upper", "lower", "top", "bottom," "left," "right," "horizontal," "vertical," etc. refer to an exemplary electrical device as viewed in a horizontal position, as shown in FIG. 2H, for example. This is done realizing that these devices can be oriented in various other positions when manufactured, when implemented in other electrical devices, when packaged, and the like.

As used herein, the terms "disposed on," "disposed onto," "deposited onto," "underlying," "overlying," or the like, refers to direct or indirect contact of one element with another element, whereas the term "directly on" or "directly onto" refers to direct contact of one element with another element, but not indirect contact between elements.

It is to be understood that unless specifically stated otherwise, references to "a," "an," and/or "the" may include one or more than one, and that reference to an item in the singular may also include the item in the plural. The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

The word "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," may refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical device comprising:

a substrate;

a temperature-sensitive material supported by the substrate, the temperature-sensitive material having a thermal degradation temperature in a range from 50° C. to 250° C.; and (i) a stress buffer layer supported by the substrate and formable at a temperature less than the thermal degradation temperature of the temperature-sensitive material such that the stress buffer layer is configured to minimize strain at an interface of the temperature-sensitive material; and/or (ii) a stress compensation layer supported by the substrate and formable at a temperature less than the thermal degradation temperature of the temperature-sensitive material such that the stress compensation layer is configured to counteract forces imparted to the substrate to thereby control an amount of substrate bow;

wherein the electrical device includes both the stress compensation layer and the stress buffer layer, which are both aluminum nitride ($AlN_x$) layers.

2. An electrical device comprising:

a substrate;

a temperature-sensitive material supported by the substrate, the temperature-sensitive material having a thermal degradation temperature in a range from 50° C. to 250° C.; and (i) a stress buffer layer supported by the substrate and formable at a temperature less than the thermal degradation temperature of the temperature-sensitive material such that the stress buffer layer is configured to minimize strain at an interface of the temperature-sensitive material; and/or (ii) a stress compensation layer supported by the substrate and formable at a temperature less than the thermal degradation temperature of the temperature-sensitive material such that the stress compensation layer is configured to counteract forces imparted to the substrate to thereby control an amount of substrate bow;

wherein the temperature-sensitive material is between the substrate and the stress buffer layer and/or the stress compensation layer;

wherein the electrical device further comprises a compressive layer overlying at least a part of the substrate;

wherein the stress compensation layer and the compressive layer impart opposing forces to one another, and the stress compensation layer has an intrinsic tensile stress that counteracts an intrinsic compressive stress of the compressive layer to thereby control the amount that the substrate bows;

wherein the compressive layer has an intrinsic compressive stress in the range from −50 MPa to −1 GPa; and wherein the stress compensation layer is between the temperature-sensitive material and the compressive layer.

3. The electrical device according to claim 2, wherein the stress buffer layer is between the temperature-sensitive material and the compressive layer.

4. An electrical device comprising:

a substrate;

a fragile material supported by the substrate, the fragile material having a $K_{IC}$ fracture toughness from 0.05 MPa·m$^{1/2}$ to 1.0 MPa·m$^{1/2}$; and (i) a stress buffer layer supported by the substrate and configured to minimize strain at an interface of the fragile material; and/or (ii) a stress compensation layer supported by the substrate and configured to counteract forces imparted to the fragile material;

wherein a coefficient of thermal expansion (CTE) of the stress buffer layer and/or a CTE of the stress compensation layer are within a range from zero to $2.0 \times 10^{-6}$/K of a CTE of the fragile material.

5. The electrical device according to claim 4,
wherein the electrical device includes the stress buffer layer which is an aluminum nitride ($AlN_x$) layer having a CTE in a range from $4.6 \times 10^{-6}$/K to $5.5 \times 10^{-6}$/K.

6. The electrical device according to claim 4,
wherein the electrical device includes both the stress compensation layer and the stress buffer layer, which are both aluminum nitride ($AlN_x$) layers having a CTE in a range from $4.6 \times 10^{-6}$/K to $5.5 \times 10^{-6}$/K.

7. The electrical device according to claim 4,
the electrical device further comprising a bonding layer including SiOx overlying at least a part of the substrate, the bonding layer having a CTE in a range from $0.6 \times 10^{-6}$/K to $3.5 \times 10^{-6}$/K;
wherein the fragile material is a photoconductor including $Hg_{1-x}Cd_xTe$ having a CTE in a range from $5.0 \times 10^{-6}$/K to $5.6 \times 10^{-6}$/K; and
wherein the stress buffer layer is configured to counteract forces imparted by a CTE mismatch between the bonding layer and the fragile material to thereby minimize strain in the fragile material or at an interface of the fragile material.

8. The electrical device according to claim 4, wherein the electrical device includes both the stress compensation layer and the stress buffer layer, which are both aluminum nitride ($AlN_x$) layers.

9. An electrical device comprising:
a substrate;
an aluminum nitride ($AlN_x$) buffer layer overlying at least a portion of the substrate; and
at least one other layer overlying at least a portion of the aluminum nitride ($AlN_x$) buffer layer;

wherein:
the at least one other layer includes:
an aluminum nitride ($AlN_x$) tensile stress layer; and
a compressive stress layer;
the aluminum nitride tensile stress layer is configured to counteract forces imparted by at least the compressive stress layer to control an amount of bow of the substrate and minimize interfacial strain in the device; and
the aluminum nitride buffer layer has an intrinsic stress value that is closer to zero than each of the compressive stress layer and the aluminum nitride tensile stress layer.

10. A 3D-integrated electrical device, comprising:
an integrated circuit having at least one vertical interconnect and a bonding layer; and
the electrical device according to claim 9, the electrical device being a photodetector in which:
the substrate includes a photoconductor layer comprising $Hg_{1-x}Cd_xTe$;
the aluminum nitride buffer layer is a neutral stress layer;
the aluminum nitride tensile stress layer overlying at least a portion of the aluminum nitride neutral stress layer;
the compressive stress layer is a bonding layer at least partially overlying the aluminum nitride tensile stress layer;
and further comprising at least one vertical interconnect;
wherein the bonding layer of the readout integrated circuit is bonded to the bonding layer of the electrical device, and wherein the at least one vertical interconnect of the readout integrated circuit is electrically connected to the at least one vertical interconnect of the electrical device.

* * * * *